(12) United States Patent
Liang

(10) Patent No.: US 8,295,416 B2
(45) Date of Patent: Oct. 23, 2012

(54) NOISE-CANCELING FREQUENCY-TO-DIGITAL CONVERTERS

(75) Inventor: Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 1119 days.

(21) Appl. No.: 12/182,457

(22) Filed: Jul. 30, 2008

(65) Prior Publication Data
US 2010/0027725 A1    Feb. 4, 2010

(51) Int. Cl.
*H03D 1/04* (2006.01)
(52) U.S. Cl. ........ 375/346; 375/285; 375/340; 375/371; 375/375; 375/376; 341/54; 341/157; 327/45; 327/48
(58) Field of Classification Search .......... 375/354–355, 375/360, 367, 371, 373, 375, 295–296, 346, 375/369, 285, 340, 376; 327/3, 45, 48, 113, 327/115, 118, 144, 145, 151, 157, 117; 455/106, 455/110, 113, 114.1–114.3, 115.1, 126; 341/54, 341/157; 332/117
See application file for complete search history.

(56) References Cited

U.S. PATENT DOCUMENTS

| | | | |
|---|---|---|---|
| 5,369,404 A * | 11/1994 | Galton | 341/143 |
| 6,219,394 B1 | 4/2001 | Sander | |
| 6,269,135 B1 | 7/2001 | Sander | |
| 6,940,438 B2 * | 9/2005 | Koe et al. | 341/143 |
| 7,424,407 B2 * | 9/2008 | Lang et al. | 702/191 |
| 7,447,271 B2 * | 11/2008 | Akita et al. | 375/267 |
| 7,755,443 B2 * | 7/2010 | Osman et al. | 332/144 |
| 2004/0198265 A1 * | 10/2004 | Wallace et al. | 455/118 |

OTHER PUBLICATIONS

Sander et al. "Polar Modulator for Multi-mode Cell Phones", IEEE Custom Integrated Circuits Conference, Sep. 2003.*
Paul Cheng-Po Liang et al., U.S. Appl. No. 12/002,733, Method of and Apparatus for Improving the Signal-to-Noise Ratio for a Digital Conversion Circuit, filed Dec. 17, 2007.
Wendell B. Sander et al., U.S. Appl. No. 12/132,926, Digital Sampling Apparatuses and Methods, filed Jun. 4, 2008.

* cited by examiner

*Primary Examiner* — Sam K Ahn
*Assistant Examiner* — Sophia Vlahos

(57) ABSTRACT

Methods and apparatuses for reducing noise in frequency to digital converters (FDCs). An FDC apparatus includes a first FDC, a second FDC and a combiner. The first and second FDCs are configured to independently sample an input signal according to a sample clock to generate first and second digital signals, each representing the instantaneous frequency of the input signal. The combiner is configured to form a resultant digital signal from the first and second digital signals. The first and second FDCs are designed and combined in the noise-canceling FDC apparatus so that the first and second signals they generate have correlated noise profiles in a frequency range of interest. When combined by the combiner to form the resultant digital signal, the resultant digital signal has a signal power to noise power ratio greater than the signal power to noise power ratios characterizing the first and second digital signals of the individual first and second FDCs.

13 Claims, 12 Drawing Sheets

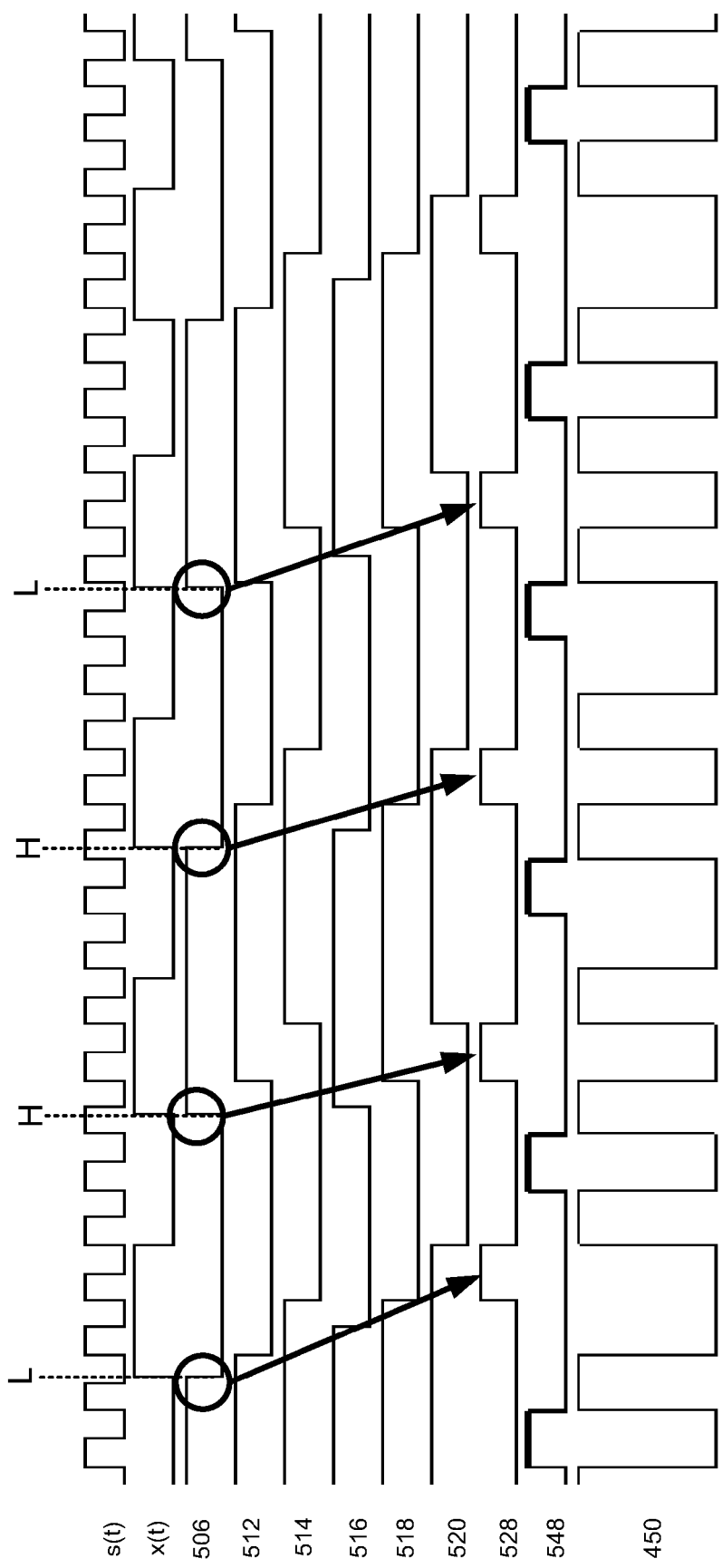

US 8,295,416 B2

NOISE-CANCELING FREQUENCY-TO-DIGITAL CONVERTERS

FIELD OF THE INVENTION

The present invention relates to methods and apparatuses for reducing noise in frequency to digital converters.

BACKGROUND OF THE INVENTION

Frequency-to-digital converters (FDCs) are used in a variety of applications in which a digital representation of the frequency of an electrical signal is needed. For example, they are commonly used in radio frequency (RF) communications transmitters to upconvert communications signals to RF.

As illustrated in FIG. 1, a typical FDC 102 samples an input signal x(t) of unknown frequency $f_x$ according to a sample clock s(t) of known frequency $f_s$, to generate a digital stream u(t) containing a sequence of logic '1's and '0's having a density or pattern of logic '1's compared to logic '0's that provides an indication of the ratio of the instantaneous frequencies of the two signals. In applications where a numeric representation of the input signal x(t) is required, a digital filter 104 is used to convert the digital stream u(t) at the FDC 102 output into digital words representing a numeric ratio of instantaneous frequencies, i.e., $f_x/f_s$. Since the sample clock s(t) frequency $f_s$ is known, the frequency $f_x$ of the input signal x(t) can be determined from the frequency ratio $f_x/f_s$.

FDCs can be constructed in a variety of different ways. FIG. 2 is a schematic diagram of an FDC 200 constructed according to one known approach. The FDC 200 comprises a plurality of D flip-flops Q1-Q22 arranged in a plurality (here, four) rows, first, second, third and fourth AND gates A1-A4, and a summer. Flip-flops Q7-Q10 and the first AND gate A1 comprise a first positive edge detector in a first row; flip-flops Q11-Q14 and the second AND gate A2 comprise a second positive edge detector in a second row; flip-flops Q15-Q18 and the third AND gate A3 comprise a third positive edge detector in a third row; and flip-flops Q19-Q22 and the fourth AND gate A4 comprise a fourth positive edge detector in a fourth row. Flip-flops Q1 and Q2 operate to divide the input signal x(t) (labeled using its frequency "$f_x$" in FIG. 2) by four, to generate a divided input signal. Flip-flops Q3-Q6 comprise a shift register, which operates to generate four shifted versions (i.e., four input signal phases) of the divided input signal.

The positive edge detectors operate in parallel to asynchronously detect rising (i.e., positive) edges in their respective input signal phases, each outputting a logic '1' for one cycle of the sample clock s(t) (labeled using its frequency "$f_s$" in FIG. 2) for each detected rising edge. The rising edges detected in each of the input signal phases are summed by the summer to form a digital sum representing the ratio of frequencies $f_x/f_s$ of the input signal x(t) and sample clock s(t). By using four positive edge detectors, the FDC 200 is able to sample an input signal x(t) having a frequency $f_x$ up to two times the sample clock frequency $f_s$.

While the above FDC 200 in FIG. 2 is fully capable of converting the frequency of the input signal x(t) to a digital signal representing the input signal's x(t)'s instantaneous frequency, it and other FDCs are known to generate significant amounts of noise during operation. This additive noise reduces the signal-to-noise ratio (SNR) at the FDC output, which can result in suboptimal performance, and in some applications make it difficult, or even impossible, to comply with noise limitation requirements specified by applicable communications standards. It would be desirable, therefore, to have FDC methods and apparatus that offer a better SNR performance than is provided by conventional FDC methods and apparatuses.

SUMMARY OF THE INVENTION

Methods and apparatuses for reducing noise in frequency to digital converters (FDCs) are disclosed. An exemplary FDC apparatus includes a first FDC, a second FDC and a combiner. The first and second FDCs are configured to independently sample an input signal according to a sample clock to generate first and second digital signals, each representing the instantaneous frequency of the input signal. The combiner is configured to form a resultant digital signal from the first and second digital signals. According to one embodiment, the first and second FDCs are designed and combined in the noise-canceling FDC apparatus so that the first and second signals they generate have correlated noise profiles in a frequency range of interest. When combined by the combiner to form the resultant digital signal, the resultant digital signal has a signal power to noise power ratio greater than the signal power to noise power ratios characterizing the first and second digital signals of the individual first and second FDCs.

The noise-canceling FDC methods and apparatus may be employed in a variety of applications, particularly those that are sensitive to noise. Examples of how the noise-canceling FDC apparatus and methods may be employed in a frequency-locked loop (FLL), a phase-locked loop (PLL), and as a phase modulator in the phase path of a polar modulation transmitter are provided.

Further features and advantages of the present invention, including a description of the structure and operation of the above-summarized and other exemplary embodiments of the invention, are described in detail below with respect to accompanying drawings, in which like reference numbers are used to indicate identical or functionally similar elements.

BRIEF DESCRIPTION OF THE DRAWINGS

FIG. 5B is a timing diagram of various signals in the FDC of FIG. 5A;

DETAILED DESCRIPTION

Figure 3:
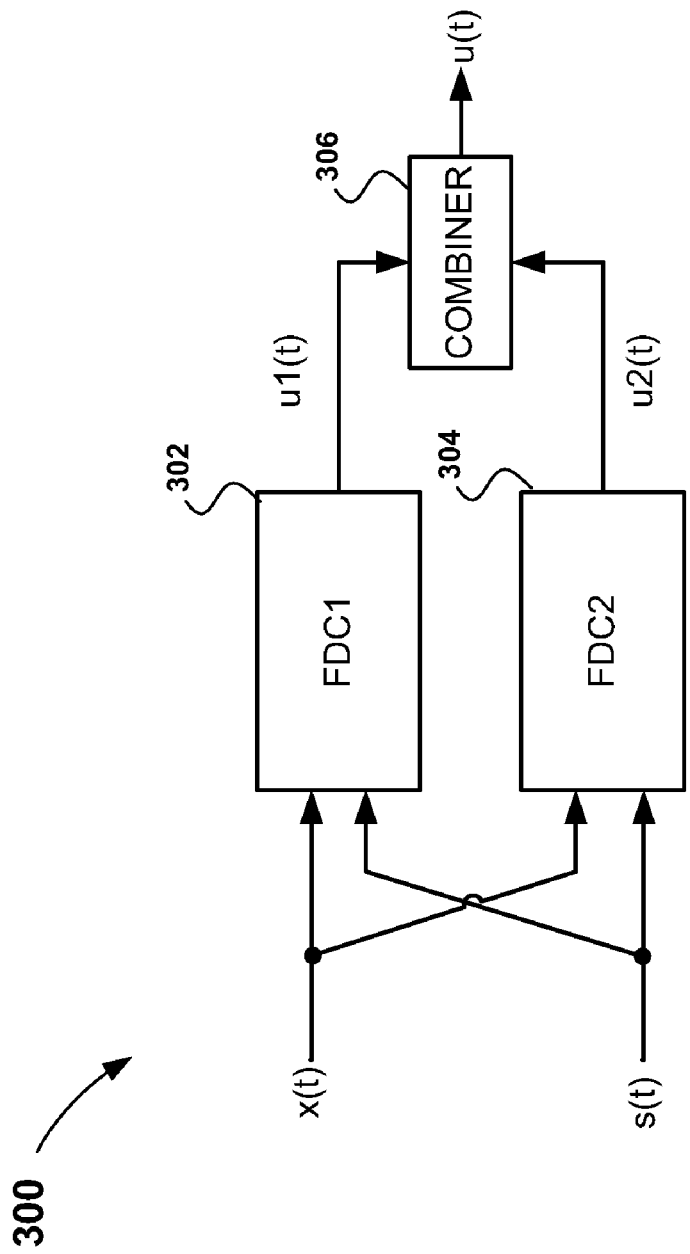
FIG. 3 is a block diagram of a noise-canceling FDC apparatus, according to an embodiment of the present invention.

Referring to FIG. 3, there is shown a block diagram of a noise-canceling frequency-to-digital converter (FDC) apparatus 300, according to an embodiment of the present invention. The noise-canceling FDC apparatus 300 comprises a first FDC 302, a second FDC 304, and a combiner 306. The first and second FDCs 302 and 304 are both configured to sample an input signal x(t) of unknown frequency $f_x$ according to a sample clock s(t) of a known frequency $f_s$, to produce first and second digital streams u1(*t*) and u2(*t*) having a pattern of logic '1's an '0's representative of the ratio of the input signal frequency $f_x$ and sample clock frequency $f_s$. The combiner 306 combines the first and second digital streams u1(*t*) and u2(*t*) to form a resultant data stream u(t).

According to one embodiment, the first and second FDCs 302 and 304 are designed to provide first and second digital streams u1(*t*) and u2(*t*) having different but correlated noise profiles, so that when combined by the combiner 306 the resultant data stream u(t) has a signal-to-noise ratio (SNR) in a frequency region of interest that is higher than the SNRs at the outputs of the individual first and second FDCs 302 and 304. Simulation results validating this noise-canceling aspect of the present invention are shown and describe below.

Figure 4A:
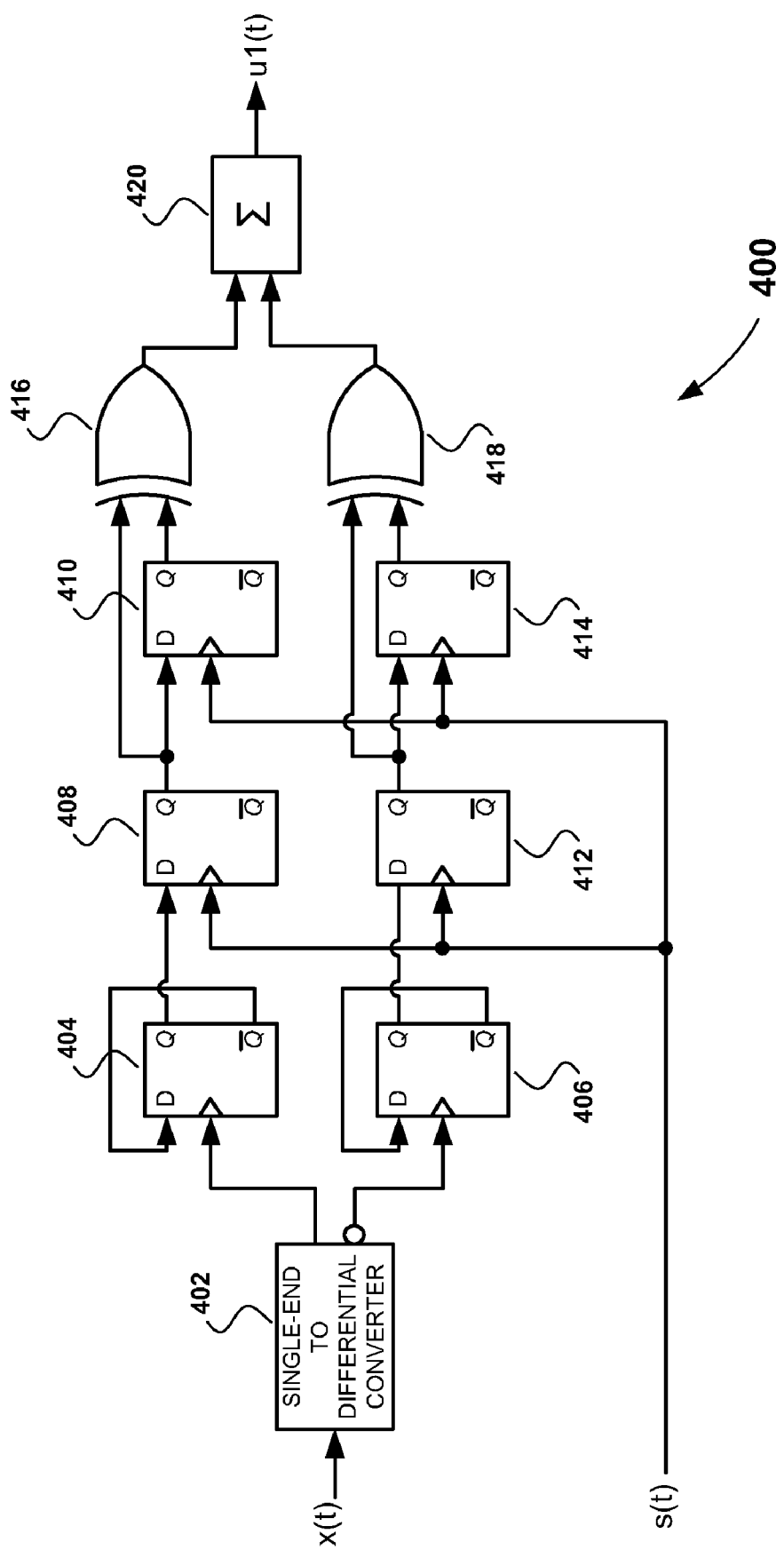
FIG. 4A is a schematic diagram of an FDC that may be used to implement the first FDC of the noise-canceling FDC apparatus in FIG. 3.

The first and second FDCs 302 and 304 of the noise-canceling FDC apparatus 300 can be implemented in various ways. FIG. 4A is a schematic diagram of an FDC 400 that may be used to implement the first FDC 302. This exemplary FDC 400 comprises a single-end to differential converter 402, a plurality of flip-flops 404-414, first and second exclusive-OR (XOR) gates 416 and 418, and a summer 420.

The plurality of flip-flops 404-414 comprises an input stage including first and second input-stage flip-flops 404 and 406, an intermediate stage including first and second intermediate-stage flip-flops 408 and 412, and a final stage including first and second final-stage flip-flops 410 and 414.

The single-end to differential converter 402 includes a single-ended input configured to receive the input signal x(t) and a differential output including inverted and noninverted outputs. The noninverted output is coupled to the clock input of the first input-stage flip-flop 404, and the inverted output is coupled to the clock input of the second input-stage flip-flop 406. The Q outputs of the first and second input-stage flip-flops 404 and 406 are coupled to the D inputs of the first and second intermediate-stage flip-flops 408 and 412, respectively. The complementary output $\overline{Q}$ of the first input-stage flip-flop 404 is fed back to the D input of the first input-stage flip-flop 404. Similarly, the $\overline{Q}$ output of the second input-stage flip-flop 406 is fed back to the D input of the second input-stage flip-flop 406.

The clock inputs of both the first and second intermediate-stage flip-flops 408 and 412 and the first and second final-stage flip-flops 410 and 414 are configured to receive a sample clock s(t). The intermediate-stage 408 and 412 and final-stage flip-flops 410 and 414 are also cascaded so that Q output of the first intermediate-stage flip-flop 408 is coupled to the D input of the first final-stage flip-flop 410 and the Q output of the second intermediate-stage flip-flop 412 is coupled to the D input of the second final-stage flip-flop 414.

The Q outputs of the first intermediate-stage flip-flop 408 and first final-stage flip-flop 410 are coupled to the inputs of the first XOR gate 416. The Q outputs of the second intermediate-stage flip-flop 412 and second final-stage flip-flop 414 are coupled to the inputs of the second XOR gate 418. Finally, the outputs of the first and second XOR gates 416 and 418 are coupled to the summer 420.

During operation, the single-end to differential converter 402 converts the input signal x(t) into inverted and noninverted input signals. The inverted input signal is fed to the clock input of the first input-stage flip-flop 404, while the noninverted input signal is fed to the clock input of the second input-stage flip-flop 406. Because each of the first and second input-stage flip-flops 404 and 406 has its $\overline{Q}$ output connected to its D input, the first and second input-stage flip-flops 404 and 406 operate as frequency dividers, effectively dividing the frequencies of the noninverted and inverted input signals in half.

The first and second intermediate-stage flip-flops 408 and 412 are clocked by the sample clock s(t), latching the Q outputs of the first and second input-stage flip-flops 404 and 406 on each rising edged of the sample clock s(t). The first and second final-stage flip-flops 410 and 412, in combination with their respective first and second XOR gates 416 and 418, each operate to perform a one-shot operation, so that on a rising edge of the input signal x(t), the output of the first XOR gate 416 is a logic '1' for one cycle of the sample clock s(t), and on falling edge of the input signal x(t), the output of the second XOR gate 418 is a logic '1'. Finally, the outputs of the first and second XOR gates 416 and 418 are summed by the summer 420 to form the desired first digital stream u1(*t*).

Figure 1:
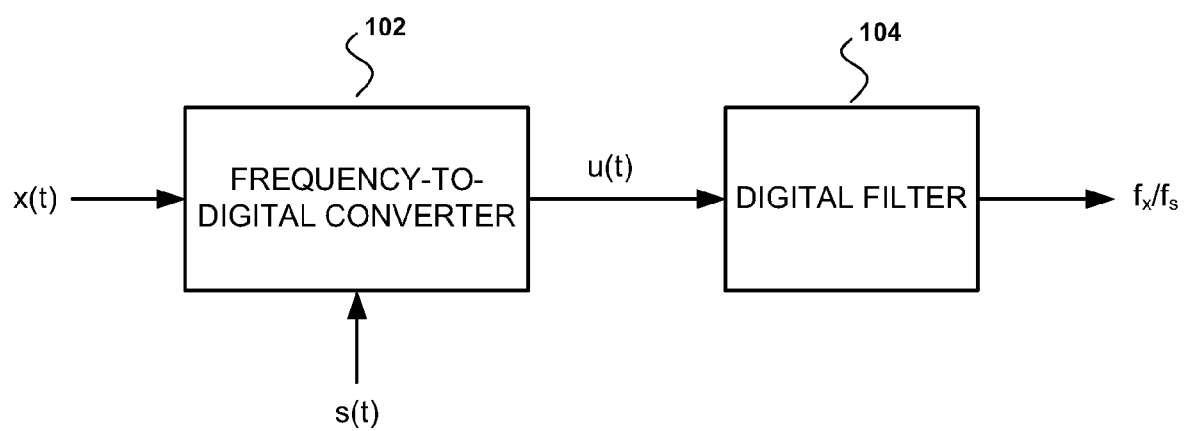
FIG. 1 is a block diagram of a frequency to digital converter (FDC) and a digital filter.
Figure 2:
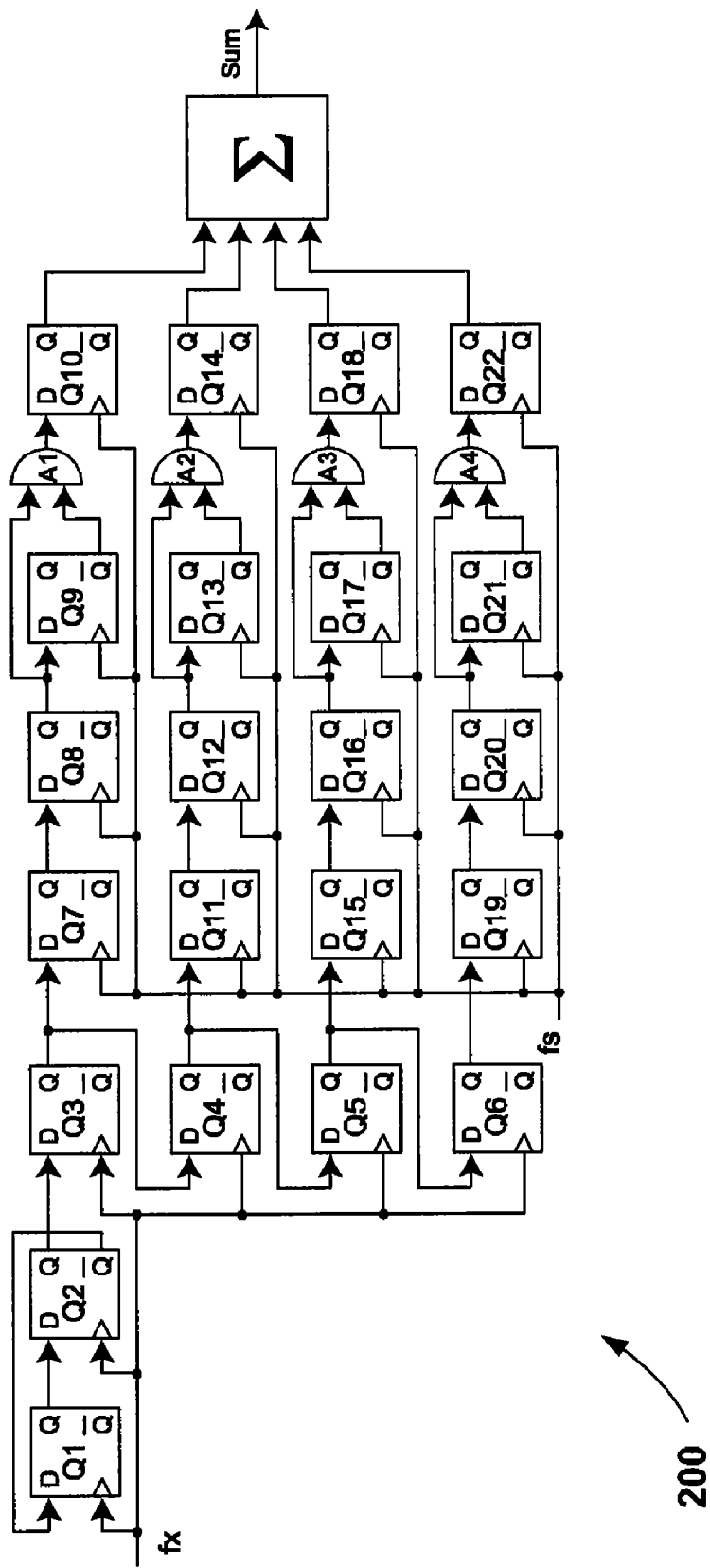
FIG. 2 is a schematic diagram of a known single-edge-detect FDC.
Figure 4B:
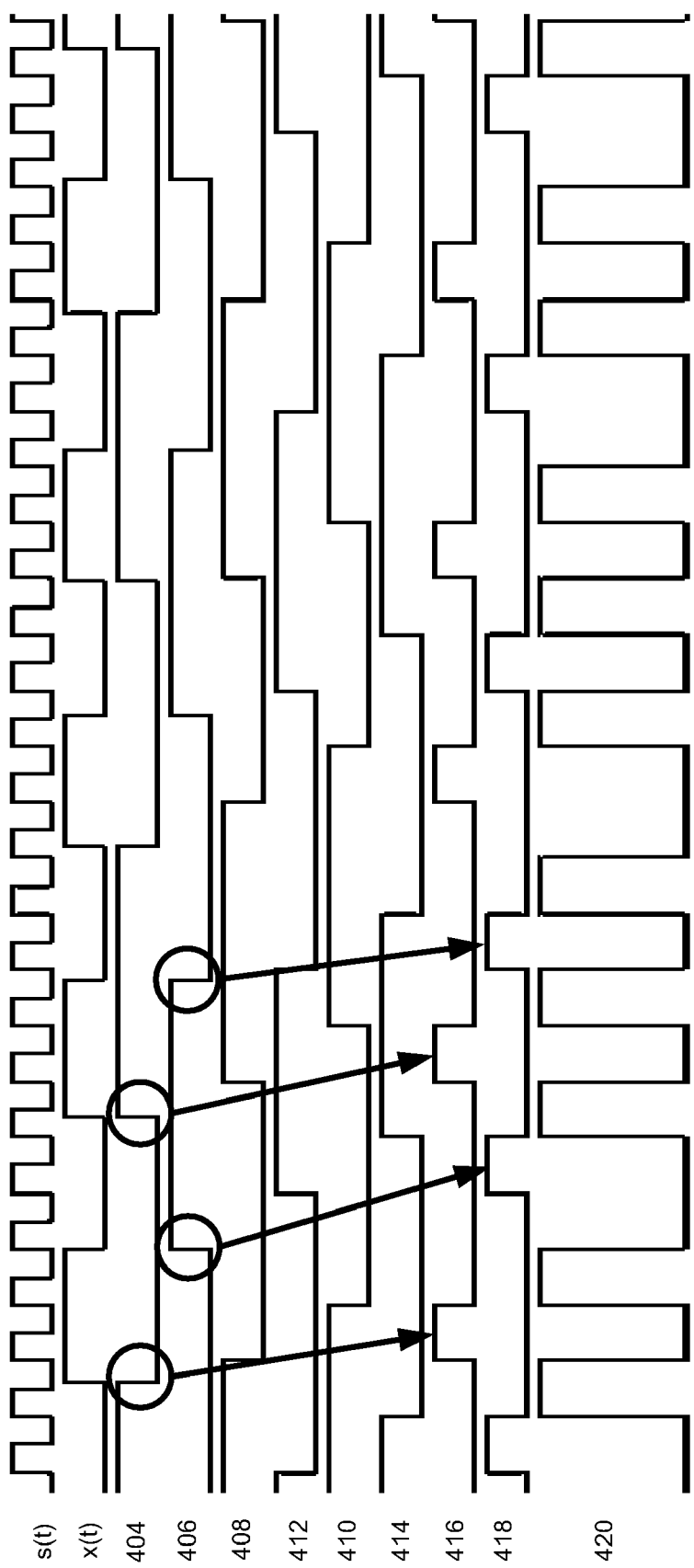
FIG. 4B is a timing diagram of various signals in the FDC of FIG. 4A.

Compared to the FDC 200 in FIG. 2, which detects only rising edges of the input signal x(t), the FDC 400 in FIG. 4A operates to detect both rising and falling edges of the input signal x(t). This is illustrated in the timing diagram in FIG. 4B, where it is seen that the signals appearing at the outputs of the first and second input-stage flip-flops 404 and 406 transition on rising and falling edges, respectively, of the original input signal x(t). These high-to-low and low-to-high level changes are latched by first and second intermediate-stage flip-flops 408 and 412 and converted into one-shots, as explained above. Because twice as many edges are detected per unit of time compared to the FDC 200 in FIG. 2, and because the noise profiles generated by both FDCs 200 and 400 are comparable, the SNR at the output of the FDC 400 in FIG. 4A is approximately 10 log(2/1)=3 dB higher than the SNR at the output of the FDC 200 in FIG. 2.

Figure 5A:
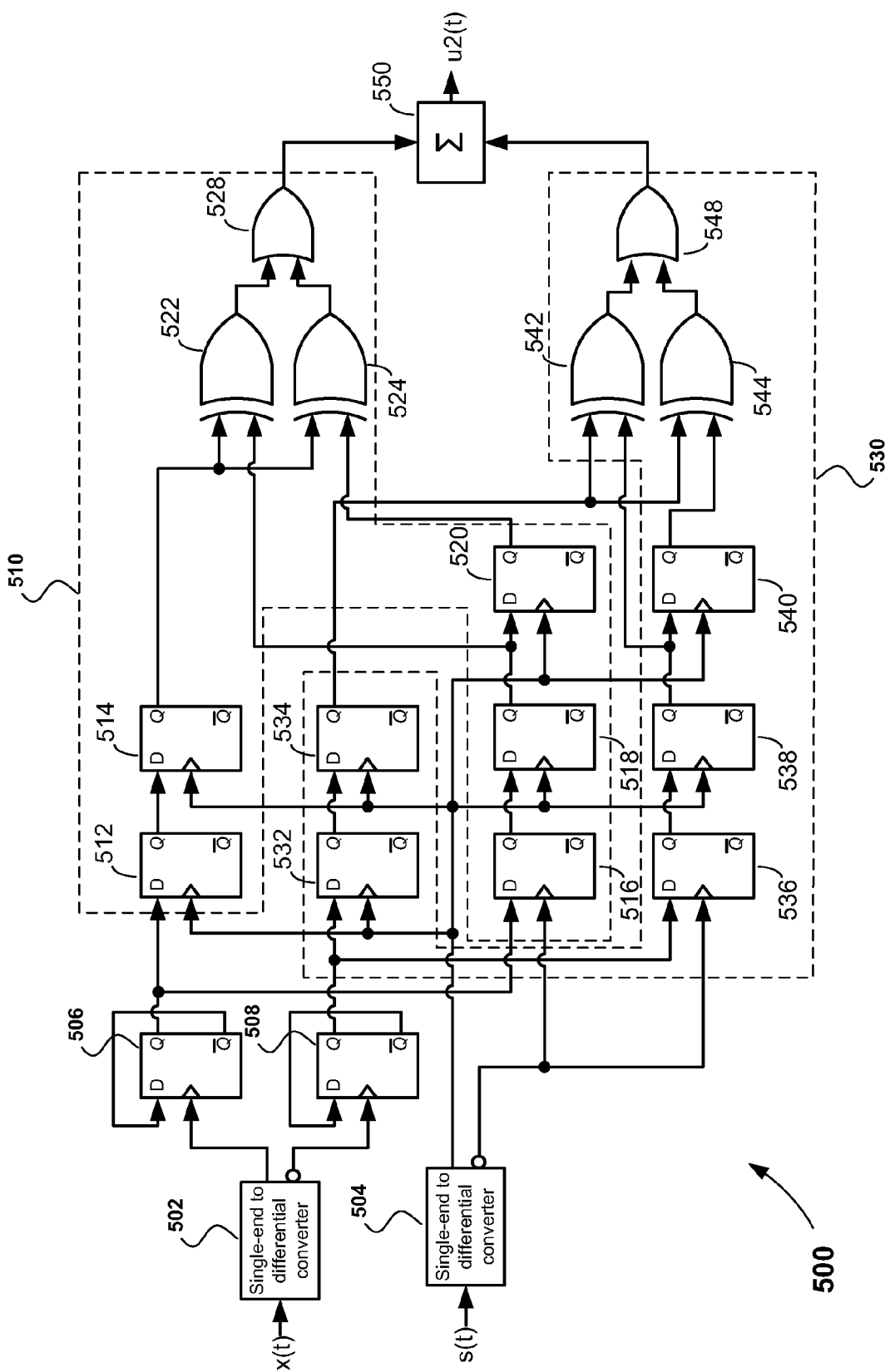
FIG. 5A is a schematic diagram of an FDC that may be used to implement the second FDC of the noise-canceling FDC apparatus in FIG. 3.

FIG. 5A is a schematic diagram of an FDC 500 that may be used to implement the second FDC 304 of the FDC apparatus 300 in FIG. 3. As explained in further detail below, the FDC 500 utilizes both the rising and falling edges of the sample clock s(t) to detect level changes in the input signal x(t). This FDC 500 provides a different noise characteristic compared to the FDC 400 in FIG. 4A. However, when integrated with the FDC 400 to form the FDC apparatus 300 in FIG. 3, the noise profiles of the signals at the outputs of the individual FDCs 400 and 500 are correlated, thereby allowing noise cancelation to be achieved.

As shown in FIG. 5A, the FDC 500 comprises first and second single-end to differential converters 502 and 504; first and second frequency dividers 506 and 508; a first level change path 510; a second level change path 530; and a summer 550. The first level change path 510 includes first and second input-stage flip-flops 512 and 516, first and second intermediate-stage flip-flops 514 and 518, a final-stage flip-flop 520; first and second XOR gates 522 and 524; and a first OR gate 528. The second level change path 530 includes first and second input-stage flip-flops 532 and 536; first and second intermediate-stage flip-flops 534 and 538; a final-stage flip-flop 540; third and fourth XOR gates 542 and 544; and a second OR gate 548.

The noninverted output of the first single-end to differential converter 502 is coupled to the clock input of the first frequency divider 506, and its inverted output is coupled to the clock input of the second frequency divider 508. The noninverted output of the second single-end to differential converter 504 is coupled to the clock inputs of the first input-stage flip-flops 512 and 532 of the first and second level change paths 510 and 530, the clock inputs of the first and second intermediate-stage flip-flops 514, 534, 518 and 538 of the first and second level change paths 510 and 530, and the clock inputs of the final-stage flip-flops 520 and 540 of the first and second level change paths 510 and 530. The inverted output of the second single-end to differential converter 504 is coupled to the clock inputs of the second input-stage flip-flops 516 and 536 of the first and second level change paths 510 and 530.

The Q outputs of the first and second intermediate-stage flip-flops 514 and 518 of the first level change path 510 are coupled to the inputs of the first XOR gate 522. The Q output of the first intermediate-stage flip-flop 514 is also coupled to one input of the second XOR gate 524. The Q output of the final-stage flip-flop 520 of the first level change path 510 is coupled to the other input of the second XOR gate 524. Similarly, the Q outputs of the first and second intermediate-stage flip-flops 534 and 538 of the second level change path 530 are coupled to the inputs of the third XOR gate 542. The Q output of first intermediate-stage flip-flop 534 is also coupled to one input of the fourth XOR gate 544. The Q output of the final-stage flip-flop 540 of the second level change path 530 is coupled to the other input of the fourth XOR gate 544. The outputs of the first and second XOR gates 522 and 524 are combined by the first OR gate 528. The outputs of the third and fourth XOR gates 542 and 544 are combined by the second OR gate 548. Finally, the outputs of the first and second OR gates 528 and 548 are coupled to the input of the summer 550.

During operation, the first single-end to differential converter 502 converts the input signal x(t) into inverted and noninverted input signals. The noninverted input signal is fed to the clock input of the first frequency divider 506, while the inverted input signal is fed to the clock input of the second frequency divider 508. Because each of the first and second frequency dividers has its $\overline{Q}$ output connected to its D input, the first and second frequency dividers 506 and 508 operate as frequency dividers, effectively dividing the frequencies of the noninverted and inverted input signals in half. The second single-end to differential converter 504 performs a similar operation, except that it operates on the sample clock s(t) to produce inverted and noninverted sample clocks.

Generating inverted and noninverted sample clocks allows the first level change path to sample the noninverted input signal using both the rising and falling edges of the sample clock s(t), and allows the second level change path to sample the inverted input signal using both the rising and falling edges of the sample clock s(t). More specifically, the components of the first level change path 510 respond to level changes in the input signal x(t) detected by the first frequency divider 506. For each level change of the input signal x(t) detected by the first frequency divider 506, a one-shot is generated at the output of the first OR gate 528 that endures for one cycle of the sample clock s(t), as can be seen in the timing diagram in FIG. 5B. When the level change is detected during a time when the sample clock s(t) is high, a single-cycle one-shot is generated at the output of the first XOR gate 522. When the level change occurs during a time when the sample clock s(t) is low, a single-cycle one-shot is generated at the output of the second XOR gate 524. The single-cycle one-shots generated at the outputs of both the first and second XOR gates 522 and 524 are combined by the first OR gate 528.

The components of the second level change path 530 operate similar to the components of the first level change path 510, except that the components of the second level change path 530 operate on the inverted version of the input signal x(t). The one-shots generated from the first and second level change paths 510 and 530 are combined by the summer 550, thereby providing the desired second digital stream u2(t).

Like the FDC 400 in FIG. 4A, both the rising and falling edges of the input signal x(t) are detected by the FDC 500 in FIG. 5A. Since twice as much signal information is garnered in the sampling process per unit time compared to single-edge-detect FDC 200 in FIG. 2, yet the noise characteristics of the FDCs 200 and 500 are very much the same, the FDC 500 in FIG. 5A has approximately a 3 dB higher SNR at its output than does the single-edge-detect FDC 200 in FIG. 2.

Figure 6:
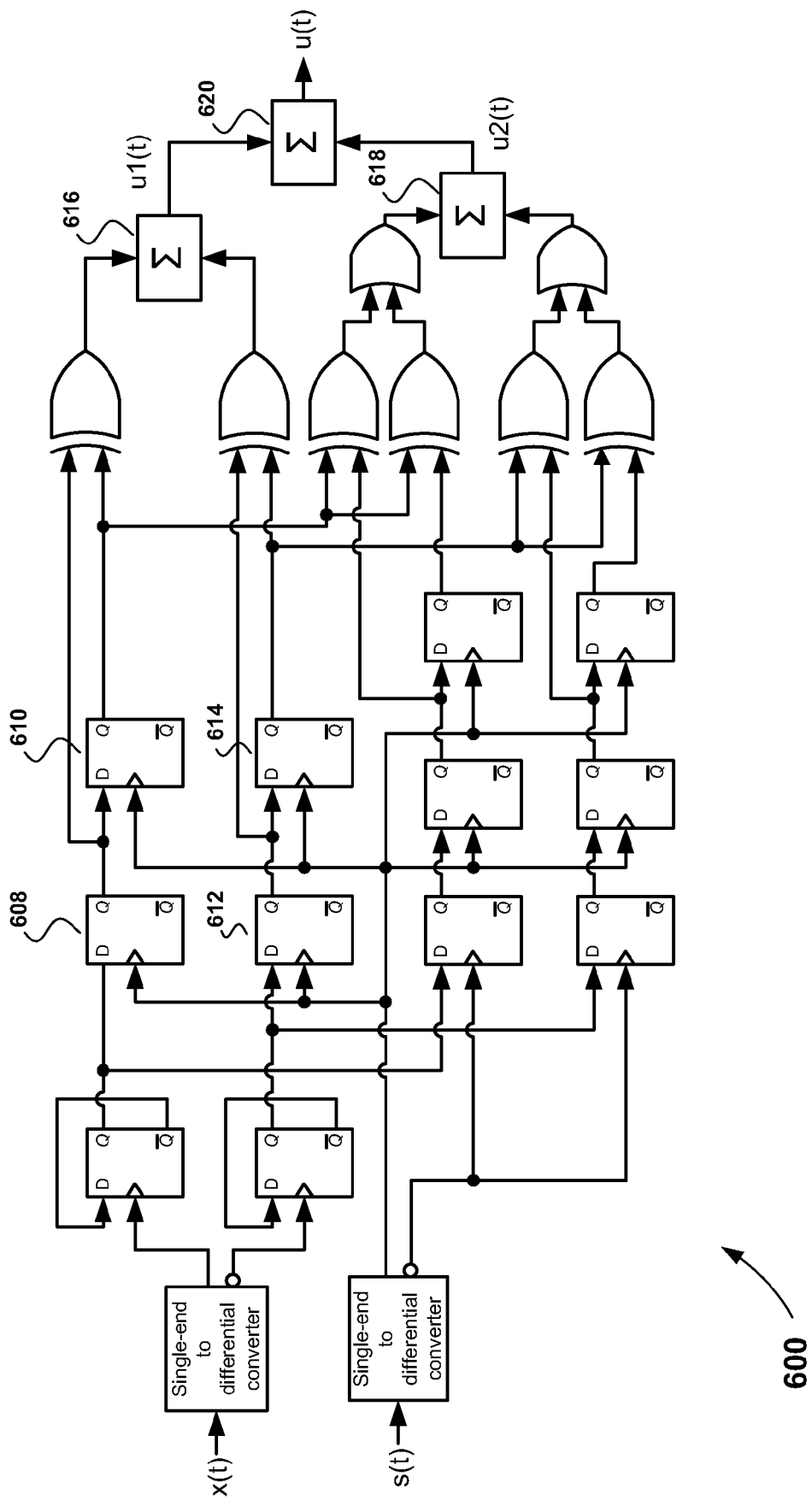
FIG. 6 is a schematic drawing of a noise-canceling FDC apparatus, according to an embodiment of the present invention.

FIG. 6 is a schematic drawing of a noise-canceling FDC apparatus 600 that integrates the FDCs 400 and 500 in FIGS. 4A and 5A, consistent with the noise-canceling FDC apparatus 300 concept shown in FIG. 3. Flip-flops 608-614 are shared between the first and second integrated FDCs 400 and 500, thereby beneficially reducing the required gate count and overall circuit size of the apparatus 600. The first and second digital streams u1(t) and u2(t) of the first and second FDCs 400 and 500 appear at the outputs of the summers 616 and 618, and are combined by a combiner 620 to generate the desired final data stream u(t). Integrating the first and second FDCs 400 and 500 in a unified FDC apparatus, results in the SNRs at the outputs of both FDCs being approximately the same over a frequency spectrum of interest. Because the noise components are correlated, noise cancelation occurs when the two signals are combined by the combiner 620.

While the FDC apparatus 600 in FIG. 6 is designed so that the noise components of the two parallel-connected FDCs are correlated, in other embodiments where the noise components are not correlated, maximum ratio combining can be employed to optimize the noise-canceling effect of the combined FDCs. Maximum ratio combining takes into account different SNRs at the outputs of each of the two FDCs, and weights the first and second digital streams u1(t) and u2(t) before or as the they are combined by the combiner 620 so that noise suppression in the resultant data stream u(t) is achieved in a frequency region of interest.

Figure 7:
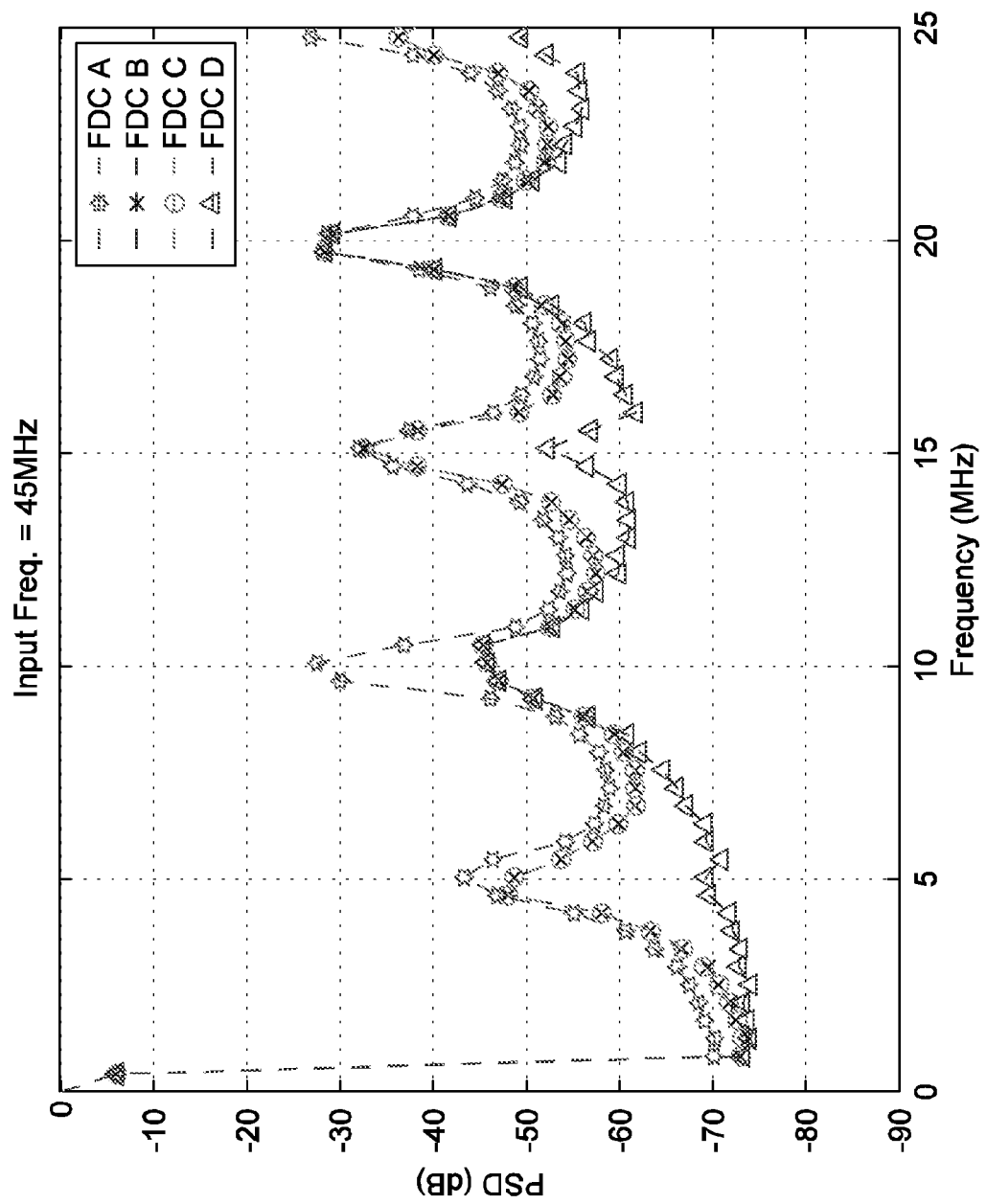
FIG. 7 is a graph showing power spectral density (PSD) plots at the outputs of the FDCs in FIGS. 2, 4A and 5A and the FDC apparatus 600 in FIG. 6, based on simulated operations of the FDCs in FIGS. 2, 4A and FIG. 5A and the noise-canceling FDC apparatus in FIG. 6.

FIG. 7 is a graph showing power spectral density (PSD) plots at the outputs of the FDC 200 in FIG. 2 ("FDC A"), the FDC 400 in FIG. 4A ("FDC B"), the FDC 500 in FIG. 5A ("FDC C") and the noise-canceling FDC apparatus 600 in FIG. 6 ("FDC D"), based on simulated operations of the FDCs 200, 400 and 500 and FDC apparatus 600 for periodic test input signal x(t) having a frequency of 45 MHz. The PSD plots are normalized so that the FDC output is centered around 0 MHz (referred to as "the desired frequency" below). Accordingly, the signal energy away from the desired frequency characterizes the noise performance of the various FDCs 200, 400 and 500 and FDC apparatus 600. Inspection of the PSD plots reveals that the noise spectrums of the FDCs 400 and 500 in FIGS. 4A and 5A ("FDC B" and "FDC C") are both about 3 dB lower than the noise spectrum of the single-edge-detect FDC 200 in FIG. 2. The approximate 3 dB noise reduction for both of the individual FDCs 400 and 500 is achieved by detecting both rising and falling edges of the input signal x(t), rather than just detecting rising or falling edges, as was explained above. More importantly, it is seen that the noise-canceling FDC apparatus 600 in FIG. 6 ("FDC D") yields the lowest noise spectrum among the four FDC designs, especially for frequencies below about 8 MHz. As explained in the application examples below, the enhanced noise suppression around the desired frequency, i.e., the lower amplitudes of close-in noise achieved by the noise-canceling effect of the noise-canceling FDC apparatus 600, provides a number of benefits.

Figure 8:
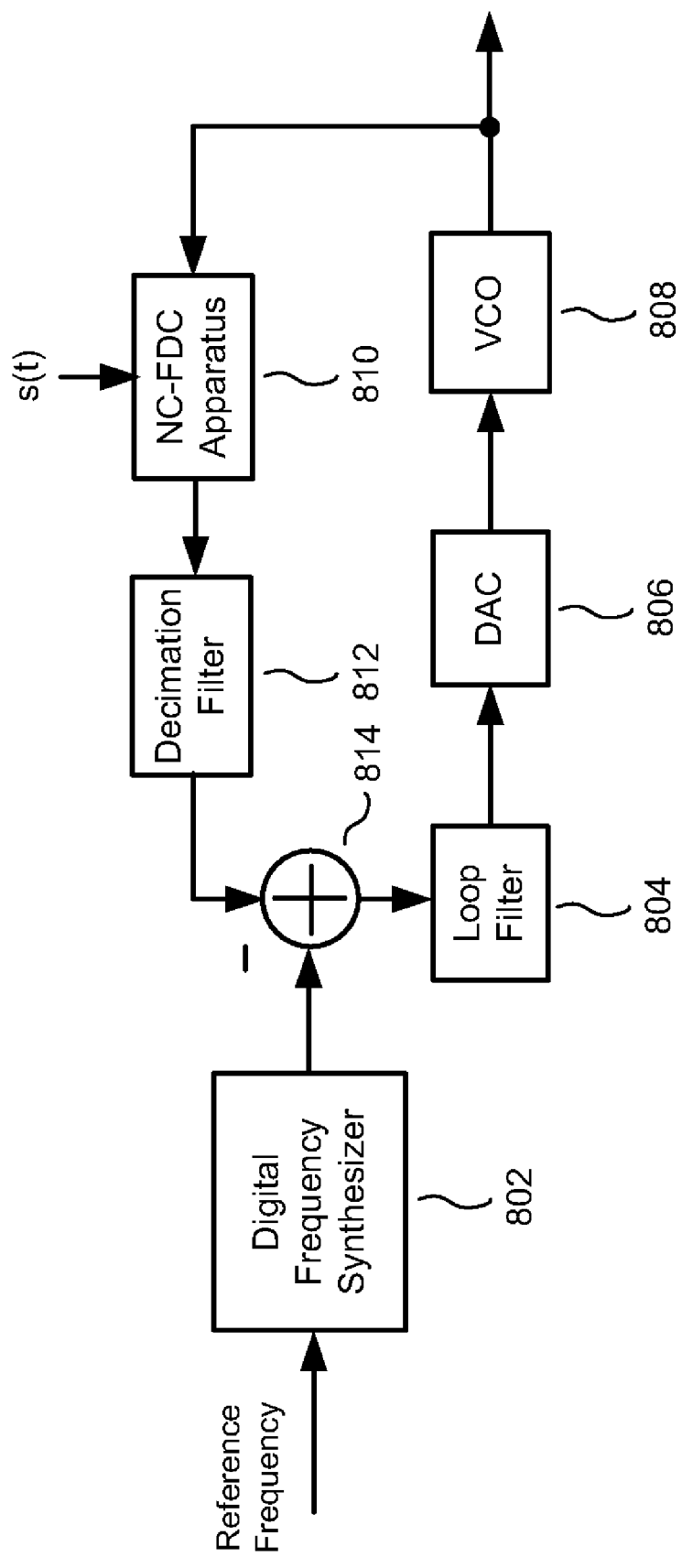
FIG. 8 is drawing illustrating how the noise-canceling FDC apparatus in FIG. 6 can be configured in a noise-canceling frequency-locked loop (NC-FLL), according to an embodiment of the present invention.

FIG. 8 is a drawing illustrating how the noise-canceling FDC apparatus 600 in FIG. 6 may be employed to form a noise-canceling FLL (NC-FLL) 800, according to an embodiment of the present invention. FLLs are used in a variety of applications. For example, they are commonly used in the phase modulation path of a polar modulation transmitter. To support wide band signals, such as are used in many modern communications technologies (e.g., such as Wideband Code Division Multiple Access (WCDMA) cellular communications systems), the FLL must have a wide loop bandwidth. Unfortunately, the loop bandwidth that can be realized in an FLL is limited by the noise performance of its FDC. This problem is overcome in the present invention by employing the noise-canceling FDC apparatus 600 in the NC-FLL 800.

As shown in FIG. 8, the NC-FLL 800 comprises a digital frequency synthesizer (DFS) 802; a main signal path including a loop filter 804, DAC 806 and voltage controlled oscillator (VCO) 808; and a feedback path including a noise-canceling FDC (NC-FDC) apparatus 810 (similar to the noise-canceling FDC apparatuses 300 and 600 in FIGS. 3 and 6), and decimation filter 812.

The NC-FLL 800 operates to force the frequency of the signal at the output of the VCO 808 (also referred to as the "actual" frequency below) towards a reference frequency (also referred to as the "desired" frequency below). The reference frequency is digitally represented by a first digital stream generated by the digital frequency synthesizer DFS 802. The desired frequency is represented by a second digital stream generated by the NC-FDC 810 and decimation filter 812 in the feedback path. The first and second digital streams are subtracted by a subtractor 814 to from a digital error stream representing the frequency error between the desired and actual frequencies. The loop filter 804 filters the digital error stream and the DAC 806 converts the filtered digital error stream to an analog error signal, which is applied to the control port of the VCO 808. The VCO 808 responds to the analog error signal by changing its output frequency so that it more closely matches the reference frequency. The modified actual frequency is again sampled by the NC-FDC apparatus 810 and decimated down to the loop rate of the main path by the decimation filter 812 to generate a new digital stream representing the modified actual frequency. The new digital stream is subtracted from the first digital stream by the subtractor to generate a new error signal for the main signal path. This process is performed continuously in an effort to lock the actual frequency to the desired frequency.

While the noise-canceling FDC 600 has been shown as being included in a FLL, it may alternatively be employed in a phase-locked loop (PLL), as will be readily appreciated by those of ordinary skill in the art. In the PLL, a phase error signal, rather than (or in addition to) the frequency error signal, would be used to achieve phase lock. The phase error signal can be generated by integrating the frequency error information represented in the digital error provided at the output of the subtractor 814. Alternatively, it can be generated by integrating the frequency information represented in the second digital stream and comparing it to the phase of the reference frequency represented in the first digital stream.

Figure 9:
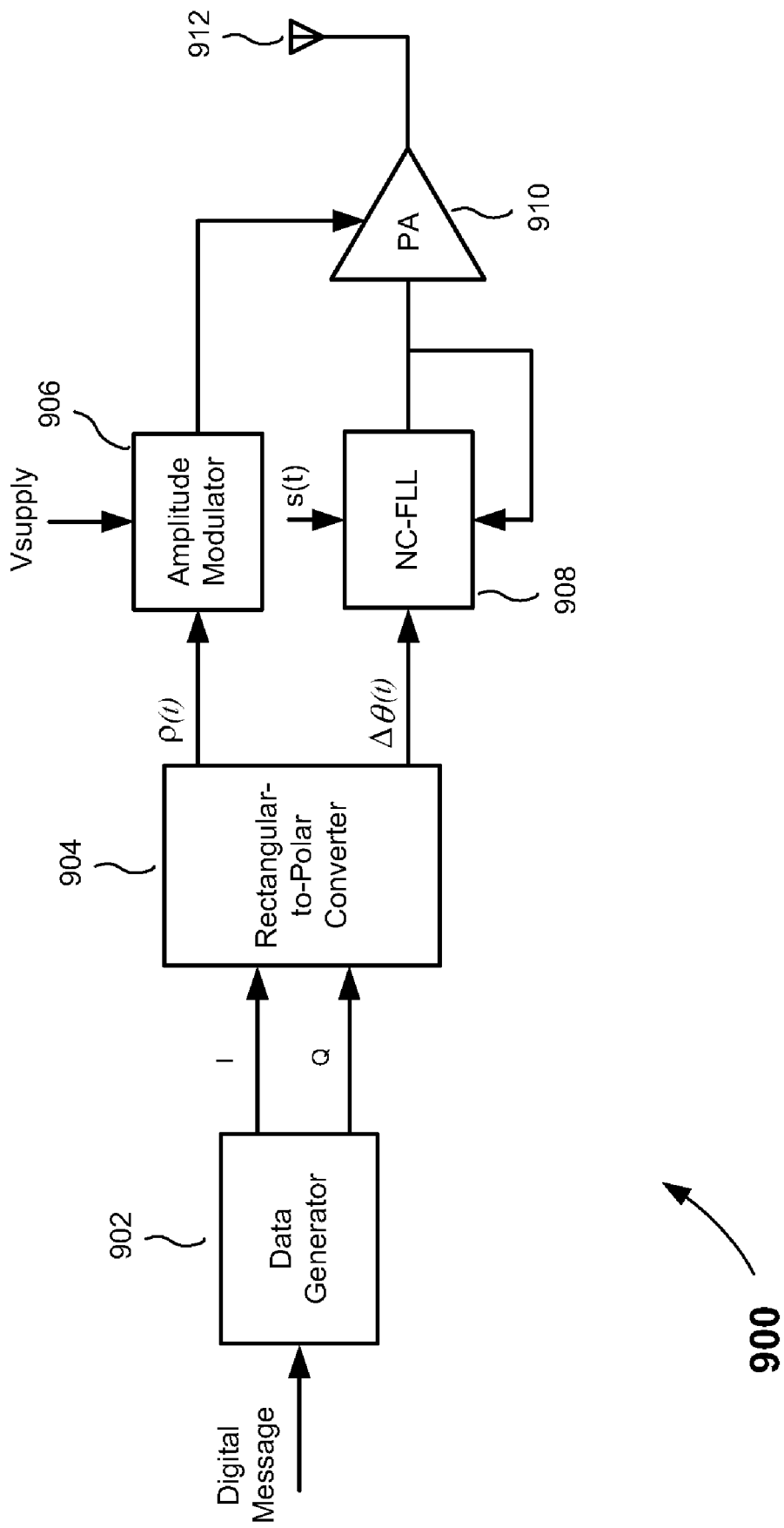
FIG. 9 is a diagram of a polar modulation transmitter including a NC-FLL, which serves as a phase modulator in the phase path of the polar modulation transmitter, according to an embodiment of the present invention.

FIG. 9 illustrates how the NC-FLL 800 in FIG. 8 can be employed in the phase path of a polar modulation transmitter 900. In this application, the NC-FLL 908 operates as a phase modulator. As shown, the polar modulation transmitter 900 comprises a data generator 902; a rectangular-to-polar converter 904; an amplitude modulator 906 configured within an amplitude path; the NC-FLL 908 configured within the phase path; a power amplifier (PA) 910; and an antenna 912.

An incoming digital message is coupled to the data generator 902 to generate rectangular-coordinate in-phase (I) and quadrature phase (Q) signals, which are modulated according to a predetermined modulation format. The rectangular-to-polar converter 904 converts the I and Q signals into a polar-coordinate amplitude component signal $\rho(t)$ and a constant-amplitude phase difference component signal $\Delta\theta(t)$. Note that when represented in digital form, the phase difference component signal $\Delta\theta(t)$ includes the sample time by sample time change in the desired phase of the modulated signal. The amplitude modulator 906 is configured to modulate a power supply voltage (Vsupply) according to amplitude variations in the amplitude component signal $\rho(t)$ to generate an amplitude-modulated power supply signal, which is coupled to the power supply port of the PA 910. Meanwhile, in the phase path, the NC-FLL 908 operates to modulate an RF carrier signal with phase difference information contained in the constant-amplitude phase difference component signal $\Delta\theta(t)$. As the phase difference information is upconverted to RF, the phase difference information is integrated so that the output signal of the NC-FLL 908 is a phase-modulated RF carrier signal. The phase-modulated RF carrier signal is coupled to the RF input port of the PA 910, which operates in compression so that the amplitude information in the amplitude-modulated power supply signal applied to the power supply port of the PA 910 is superimposed on the phase-modulated RF carrier signal as the phase-modulated RF carrier signal is amplified by the PA 910. Finally, the antenna 912 radiates the resulting amplitude- and phase-modulated RF carrier signal over the air to a remote receiver.

Figure 10:
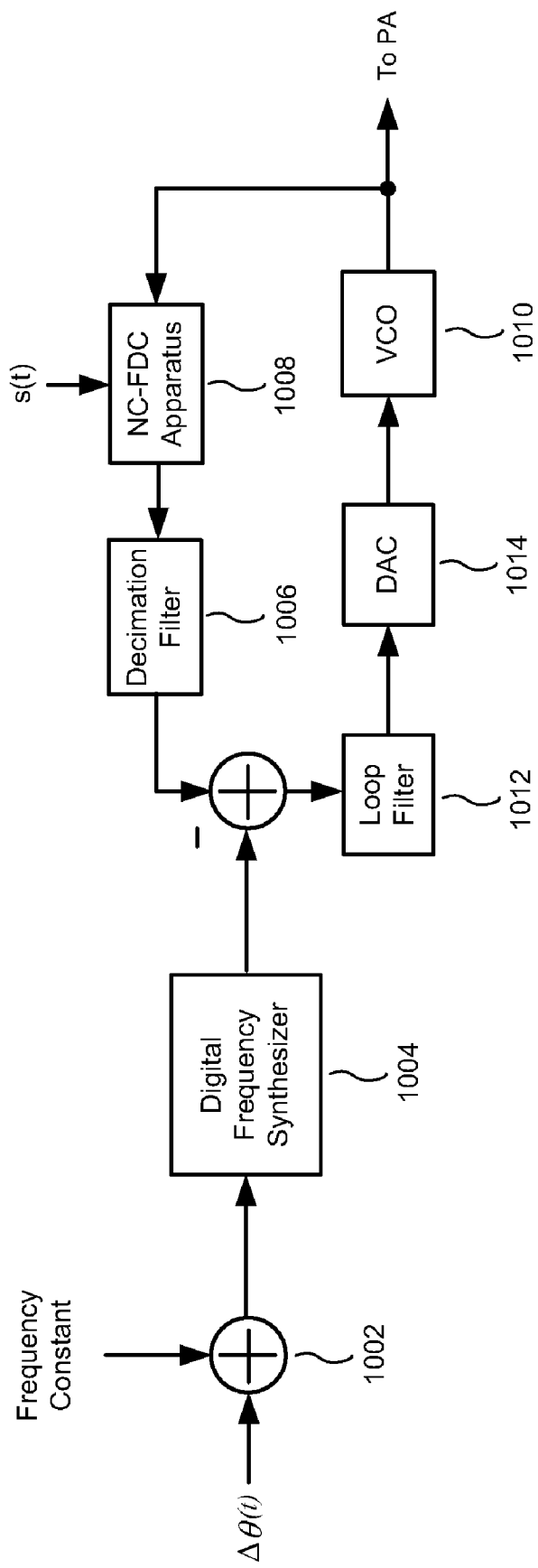
FIG. 10 is a drawing illustrating in more detail the NC-FLL used in the polar modulation transmitter in FIG. 9.

FIG. 10 is a drawing illustrating the NC-FLL 908 in more detail. The desired output frequency is derived from two sources represented in digital form. The first source is a digital frequency constant representing the center frequency of the VCO 1010 for a particular channel, for example. The second source is the phase difference component signal $\Delta\theta(t)$. These two digital signals are summed by a summer 1002, and presented to a DFS 1004, which generates a first digital stream representing the desired output frequency deviation from the VCO center frequency. Similar to explained above, a decimation filter 1006 in the feedback path of the FLL decimates the digital stream generated by NC-FDC 1008 down to the clock rate of the main path. The resulting second digital stream is then subtracted from the first digital stream to produce a digital error stream. The digital error stream is filtered by the loop filter 1012 and converted to an analog error signal by the DAC 1014, to generate an analog error signal which the VCO 1010 responds to in minimizing the frequency error between the actual and desired output frequencies.

While the above is a complete description of the preferred embodiments of the invention sufficiently detailed to enable those skilled in the art to build and implement the system, it should be understood that various changes, substitutions, and alterations may be made without departing from the spirit and scope of the invention as defined by the appended claims.

What is claimed is:

1. A frequency-to-digital converter (FDC) apparatus, comprising:
a first FDC configured to sample an input signal according to a sample clock to generate a first digital signal representing a frequency of said input signal;
a second FDC coupled to said first FDC configured to sample said input signal according to said sample clock to generate a second digital signal representing the frequency of said input signal; and
a combiner configured to combine said first and second digital signals, wherein said combiner is configured to weight the first and second digital signals in proportion to a signal-to-noise ratios (SNR) at the output of said first FDC compared to a SNR at the output of said second FDC; and
said first and second FDCs are configured to generate said first and second digital signals having correlated noise characteristics in a frequency region of interest.

2. The FDC apparatus of claim 1 wherein said first FDC is coupled in parallel with said second FDC.

3. The FDC apparatus of claim 1 wherein said combiner is configured to combine the first and second digital signals so that a signal-to-noise ratio (SNR) at the output of said combiner is greater than the SNR at the output of said first FDC.

4. The FDC apparatus of claim 3 wherein said combiner is further configured to combine the first and second digital signals so that the SNR at the output of said combiner is also greater than the SNR at the output of said second FDC.

5. The FDC apparatus of claim 1 wherein said first and second FDCs are configured to generate said first and second digital signals having correlated noise characteristics so that a signal-to-noise ratio (SNR) at the output of said combiner is greater than the SNR at the output of said first FDC in the frequency region of interest.

6. A frequency-to-digital converter (FDC) apparatus, comprising:
first means for sampling a frequency of an electrical signal to generate a first data stream;
second means for sampling the frequency of said electrical signal to generate a second data stream; and
means for combining the first and second data streams to generate a resultant data stream having a signal power to noise power ratio in a frequency band of interest that is higher than a signal power to noise power ratio of the first data stream.

7. The FDC apparatus of claim 6 wherein said means for combining the first and second data streams is further operable to generate said resultant data stream so that said signal power to noise power ratio of said resultant data stream is higher in said frequency band of interest than a signal power to noise power ratio of said second data stream.

8. The FDC apparatus of claim 6 wherein said first and second means for sampling the frequency of said electrical signal are configured to generate said first and second digital signals having correlated noise components.

9. A method of generating a digital representation of a frequency of an electrical signal, comprising:
sampling an electrical signal to form a first data stream containing frequency information representative of a frequency of the electrical signal, said first data stream having a first frequency-dependent noise profile;
sampling said electrical signal to form a second data stream containing frequency information representative of the frequency of the electrical signal, said second data stream having a second frequency-dependent noise profile; and
forming a resultant data stream from said first and second data streams, said resultant data stream characterized by a signal-to-noise ratio (SNR) that is higher than a SNR characterizing said first data stream in a frequency band of interest, wherein forming the resultant data stream comprises:
weighting the first data stream in proportion to the SNR characterizing the first data stream;
weighting the second data stream in proportion to a SNR characterizing the second data stream; and
combining the weighted first and second data streams;
wherein said first and second frequency-dependent noise profiles are correlated in said frequency band of interest.

10. The method of claim 9 wherein forming the resultant data stream further results in a resultant data stream SNR that is higher than a SNR characterizing said second data stream in said frequency band of interest.

11. The method of claim 9 wherein forming the resultant data stream comprises summing the first and second data streams.

12. A frequency-to-digital converter (FDC) apparatus, comprising:
a first FDC configured to sample an input signal according to a sample clock to generate a first digital signal representing a frequency of said input signal;
a second FDC coupled to said first FDC configured to sample said input signal according to said sample clock to generate a second digital signal representing the frequency of said input signal; and
a combiner configured to combine said first and second digital signals, wherein said combiner is configured to weight the first and second digital signals in proportion to a signal to noise ratio (SNR) at the output of said first FDC compared to a signal to noise ratio (SNR) at the output of said second FDC,
wherein said first and second FDCs are configured to generate said first and second digital signals having correlated noise characteristics so that the signal-to-noise ratio (SNR) at the output of said combiner in a frequency region of interest is greater than the respective SNRs at the outputs of said first FDC and said second FDC.

13. The FDC apparatus of claim 12 wherein said first FDC is coupled in parallel with said second FDC.

* * * * *